(12) United States Patent
Chiu et al.

(10) Patent No.: US 8,474,626 B2
(45) Date of Patent: Jul. 2, 2013

(54) FOUP AND ROBOTIC FLANGE THEREOF

(75) Inventors: Ming-Chien Chiu, Tucheng (TW); Pao-Yi Lu, Tucheng (TW); Kuo Chun Hung, Tucheng (TW)

(73) Assignee: Gudeng Precision Industrial Co., Ltd., Taipei County (TW)

( * ) Notice: Subject to any disclaimer, the term of this patent is extended or adjusted under 35 U.S.C. 154(b) by 223 days.

(21) Appl. No.: 12/766,103

(22) Filed: Apr. 23, 2010

(65) Prior Publication Data

US 2011/0005966 A1 Jan. 13, 2011

(30) Foreign Application Priority Data

Jul. 10, 2009 (TW) .............................. 98123299 A (51) Int. Cl.
*B65D 85/00* (2006.01)
(52) U.S. Cl.
USPC .......................................... 206/711; 206/454
(58) Field of Classification Search
USPC .......... 438/106; 414/935, 217.1, 217; 403/98, 403/113, 82, 70; 29/428; 428/689, 309.1, 428/226.12; 220/751, 41.18, 41.14; 206/832, 206/711, 454
See application file for complete search history.

(56) References Cited

U.S. PATENT DOCUMENTS

| | | |
|---|---|---|
| 4,532,970 A | 8/1985 | Tullis et al. |
| 4,676,709 A | 6/1987 | Bonora et al. |
| 4,739,882 A | 4/1988 | Parikh et al. |
| 4,815,912 A | 3/1989 | Maney et al. |
| 4,827,567 A * | 5/1989 | Beach .............................. 16/422 |
| 4,995,430 A | 2/1991 | Bonora et al. |
| 5,024,329 A | 6/1991 | Grohrock |
| 5,445,271 A | 8/1995 | Kakizaki et al. |
| 5,452,795 A | 9/1995 | Gallagher et al. |
| 5,469,963 A | 11/1995 | Bonora et al. |
| 5,482,161 A | 1/1996 | Williams et al. |
| 5,555,981 A | 9/1996 | Gregerson |
| 5,570,987 A | 11/1996 | McKenna |
| 5,588,625 A * | 12/1996 | Beak .............................. 248/371 |
| 5,722,707 A | 3/1998 | Hosoi |
| 5,992,638 A | 11/1999 | Gregerson et al. |
| 6,010,008 A * | 1/2000 | Nyseth et al. .................. 206/711 |
| 6,010,111 A * | 1/2000 | Cho .......................... 248/346.06 |
| 6,039,186 A | 3/2000 | Bhatt et al. |
| 6,193,430 B1 | 2/2001 | Culpepper et al. |
| 6,216,874 B1 | 4/2001 | Bores et al. |
| 6,382,419 B1 | 5/2002 | Fujimori et al. |
| 6,389,706 B1 | 5/2002 | Kuebart et al. |
| 6,389,707 B1 | 5/2002 | Peiter et al. |
| 6,390,754 B2 | 5/2002 | Yamaga et al. |

(Continued)

*Primary Examiner* — J. Gregory Pickett
*Assistant Examiner* — Kaushikkumar Desai
(74) *Attorney, Agent, or Firm* — Ming Chow; Sinorica, LLC (57) ABSTRACT

A wafer container includes a container body, which comprises a plurality of sidewalls, a bottom, and a top to define a space for containing wafers, an opening being formed on one sidewall, and a door with an outer surface and an inner surface. The top of the container body is disposed with a robotic flange which comprises a foolproof structure and a hemi-circular snap-hook portion that are disposed at the center and its circumference of a lower surface of the robotic flange facing the top. The foolproof structure has a geometric hole for a protruding portion on the top of the container body to be plugged in. After the protruding portion is plugged into the geometric hole, the robotic flange is further rotated along the container body about 180 degrees for the hemi-circular snap-hook portion to be engaged in a hemi-circular supporting portion on the top of the container body.

8 Claims, 10 Drawing Sheets

U.S. PATENT DOCUMENTS

| | | | |
|---|---|---|---|
| 6,398,033 | B1 | 6/2002 | Wu et al. |
| 6,428,729 | B1 | 8/2002 | Bhatt et al. |
| 6,446,806 | B1 | 9/2002 | Ohori et al. |
| 6,491,177 | B1 | 12/2002 | Hyobu |
| 6,520,338 | B2 | 2/2003 | Bores et al. |
| 6,682,797 | B1 | 1/2004 | Otoi et al. |
| 6,736,268 | B2 | 5/2004 | Nyseth et al. |
| 6,779,667 | B2 | 8/2004 | Nigg et al. |
| 6,811,029 | B2 | 11/2004 | Eggum |
| 6,848,578 | B2 | 2/2005 | Eggum |
| 6,871,741 | B2 | 3/2005 | Bhatt et al. |
| 6,923,325 | B2 | 8/2005 | Duban-Hu et al. |
| 6,981,832 | B2 | 1/2006 | Zinger et al. |
| 6,993,809 | B2 | 2/2006 | Chin-Kang |
| 7,121,414 | B2 | 10/2006 | Beckhart et al. |
| 7,131,176 | B2 | 11/2006 | Eggum |
| 7,168,564 | B2 | 1/2007 | Bhatt et al. |
| 7,172,981 | B2 | 2/2007 | Kobayashi |
| 7,175,026 | B2 | 2/2007 | Hachtmann |
| 7,328,727 | B2 | 2/2008 | Tieben et al. |
| 7,337,911 | B2 | 3/2008 | Wu et al. |
| 7,347,329 | B2 | 3/2008 | Burns et al. |
| 7,357,257 | B2 | 4/2008 | Matsutori et al. |
| 7,370,764 | B2 | 5/2008 | Nyseth et al. |
| 7,383,955 | B2 | 6/2008 | Matsutori et al. |
| 7,390,758 | B2 | 6/2008 | Kobayashi |
| 7,410,061 | B2 | 8/2008 | Matsutori et al. |
| RE40,513 | E | 9/2008 | Krampotich et al. |
| 7,497,333 | B2 | 3/2009 | Matsutori et al. |
| 7,520,388 | B2 | 4/2009 | Matsutori et al. |
| 7,677,393 | B2 | 3/2010 | Burns et al. |
| 7,677,394 | B2 | 3/2010 | Conarro |
| 2001/0040116 | A1 | 11/2001 | Hyobu et al. |
| 2002/0020650 | A1* | 2/2002 | Fujimori et al. ............... 206/454 |
| 2002/0038773 | A1 | 4/2002 | Fujimori et al. |
| 2002/0114686 | A1 | 8/2002 | Glynn et al. |
| 2007/0231110 | A1* | 10/2007 | Akiyama .................. 414/217 |

\* cited by examiner

FOUP AND ROBOTIC FLANGE THEREOF

BACKGROUND OF THE INVENTION

1. Field of the Invention

The present field of the invention is related to a Front Opening Unified Pod (FOUP), and more particularly, to the lock-fastening structure of robotic flange of FOUP and its assembly method.

2. Description of the Prior Art

Figure 1:
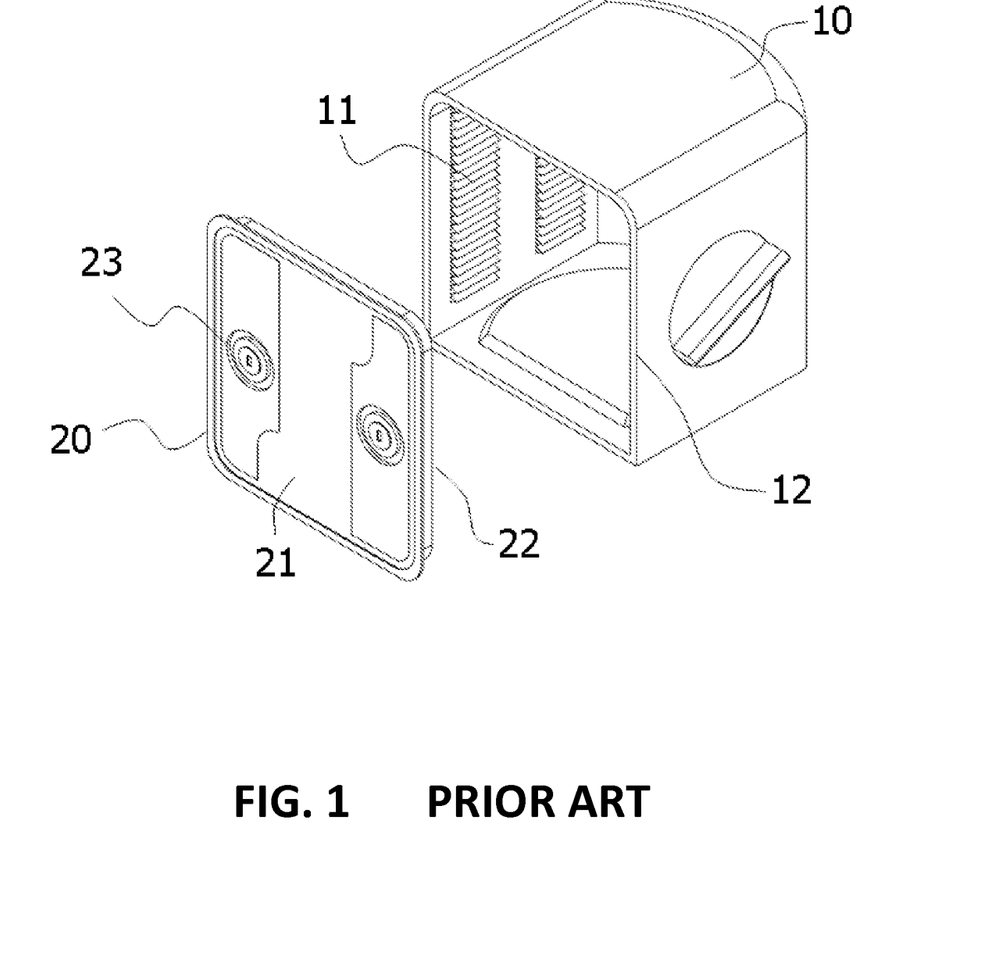
FIG. 1 is a view of FOUP of the prior art.

The semiconductor wafers are transferred to different work stations to apply the various processes in the required equipments. A sealed container is provided for automatic transfer to prevent the pollution from occurring during transferring process. FIG. 1 is a view of wafer container of the prior art. The wafer container is a Front Opening Unified Pod (FOUP) which includes a container body 10 and a door 20. The container body 10 is disposed with a plurality of slots 11 for horizontally placing a plurality of wafers, and an opening 12 is located on a sidewall of the container body 10 for importing and exporting the wafers. The door 20 further includes an outer surface 21 and an inner surface 22, wherein the door 20 is joined with the opening 12 of the container body 10 via the inner surface 22 to protect the plurality of wafers within the container body 10. Furthermore, at least one latch hole 23 is disposed on the outer surface 21 of the door 20 for opening or closing the wafer container. According to the aforementioned, due to that the wafer is horizontally placed in the container body 10, thus, a wafer restraint component is needed in the FOUP to prevent the wafer from displacement or from movement toward the opening of container body 10 to occur during the wafer transportation due to vibration.

To ensure a smooth process of transferring the FOUP between different stations, a robotic flange (not shown in Figure) is disposed on the top of the container body of FOUP for being gripped by an automation machine. In the FOUP disclosed in U.S. Pat. No. 6,010,008 and U.S. Pat. No. 7,357,257, screws and linear grooves are utilized for fixing the robotic flange to the top of the container body. However, when linear grooves are disposed on the robotic flange and linear snap-hooks are disposed on the top of the container body, abrasion or particles easily occur due to friction. Moreover, utilization of linear grooves only may lead to the fixing of the front end of robotic flange to the back end of the top and the result is that the robotic flange is reversely fixed to the FOUP and cannot be gripped by the automation machine.

SUMMARY OF THE INVENTION

In wafer container of the prior art, the method for lock-fastening the robotic flange easily causes the problems of abrasion, particles, and reverse fixing. One objective of the present invention is thus to provide a FOUP with robotic flange, in which the robotic flange is fixed to the FOUP by utilizing a circular-arc snap-hook and snap-slot. As the snap-hook and the snap-slot are in circular-arc shape, the abrasion or particles due to friction can thus be reduced.

Another objective of the present invention is to provide a FOUP with robotic flange, in which the robotic flange is further disposed with a foolproof structure to prevent the robotic flange from being reversely fixed to the FOUP and allow the automation machine to readily grip the robotic flange and the FOUP.

According to the objectives above, the present invention provides a FOUP with robotic flange, which includes a container body and a door. A plurality of slots are disposed in the container body for sustaining a plurality of wafers, and an opening is formed on one sidewall of the container body for importing and exporting the plurality of wafers. A robotic flange is disposed on the top of the container body and has a lower surface facing the top of the container body, a foolproof structure and a hemi-circular snap-hook portion being further disposed at the center and circumference of the center of the lower surface. The foolproof structure has a geometric hole for a protruding portion on the top of the container body to be plugged in. Therefore, after the protruding portion is plugged into the geometric hole and the robotic flange is further rotated about 180 degrees, the hemi-circular snap-hook portion is thus engaged in a hemi-circular sliding portion on the top of the container body.

The present invention further discloses a method for connection of the FOUP with robotic flange, the steps of which comprising: providing a FOUP with a top, a protruding portion and a hemi-circular sliding portion being disposed on the top; providing a robotic flange with a lower surface on which a geometric hole and a hemi-circular snap-hook portion are disposed; aligning the robotic flange with the FOUP at certain angle for the protruding portion of the FOUP to be plugged into the hole of the robotic flange; and rotating the robotic flange about 180 degrees for the hemi-circular snap-hook portion to be engaged in the hemi-circular sliding portion.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In order to disclose the skills applied in, the objectives of, and the effects achieved by the present invention in a more complete and clearer manner, preferred embodiments are herein described below in detail with related drawings disclosed for reference.

Figure 2:
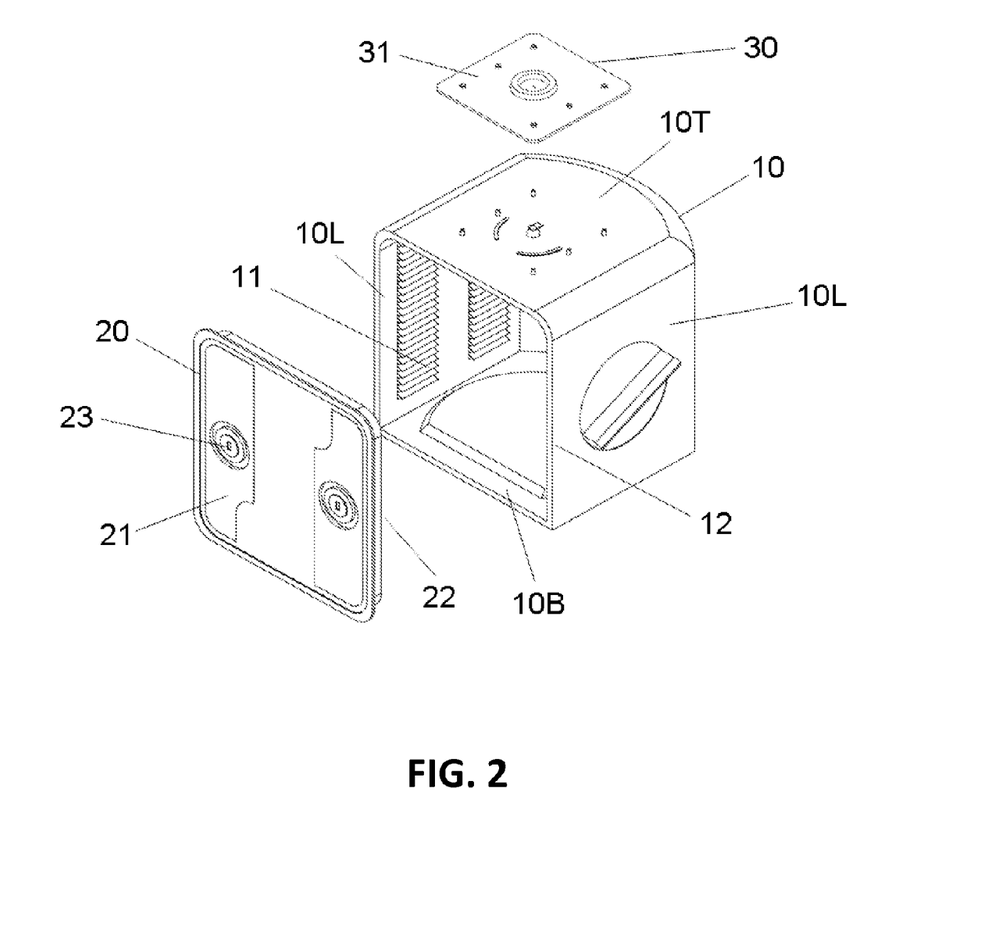
FIG. 2 is a view of FOUP of the present invention.

First, referring to FIG. 2, which is a view of a FOUP and its robotic flange of the present invention. The FOUP comprises a container body 10 and a door 20. The container body 10 has a plurality of sidewalls 10L, a bottom 10B, and a top 10T for forming an accommodating space in which a plurality of supporters 11 are disposed for supporting a plurality of wafers. An opening 12 is formed on one sidewall 10L of the container body 10 for importing and exporting the wafers. The door 20 has an outer surface 21 and an inner surface 22, wherein the outer surface 21 is disposed with at least a latch hole 23 for an enclosed space to be formed when the inner surface 22 of the door 20 is connected to the opening 12 of the container body 10 after a key is plugged into the latch hole 23 and turned. Moreover, a robotic flange 30 is further disposed on the top 10T of the container body and can be gripped by an automation machine to facilitate the process of transferring FOUP between different work stations or semiconductor manufacture equipments.

Figure 3:
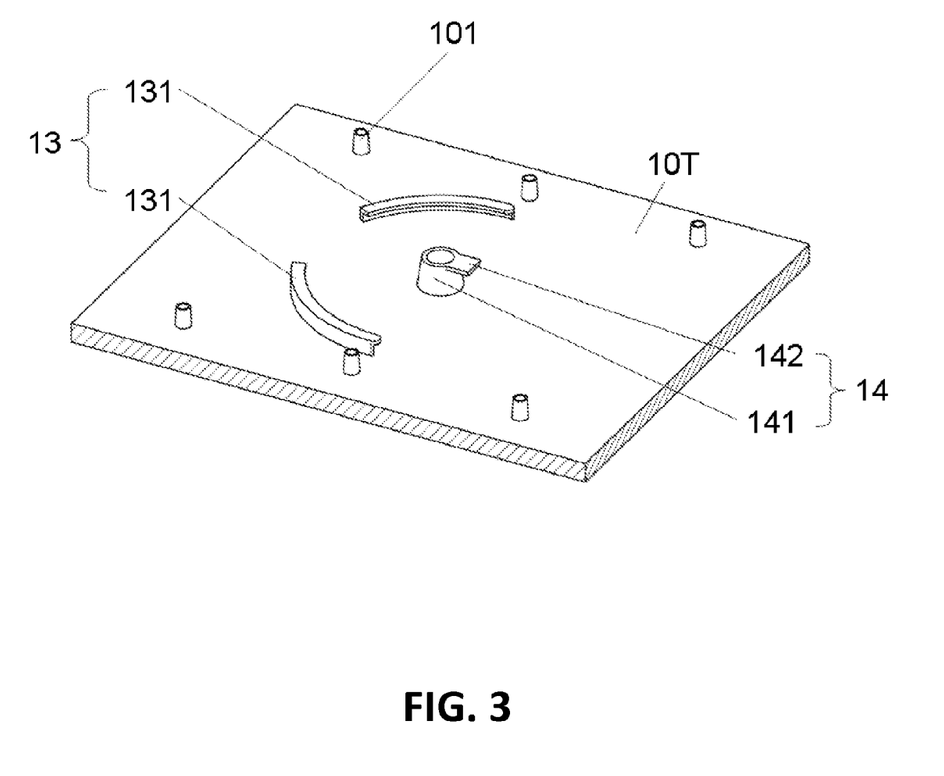
FIG. 3 is a view of the top of the container body of FOUP of the present invention.

Then, referring to FIG. 3, which is a view of the top of container body of the aforementioned FOUP. Different fixing interfaces are disposed on the top 10T for fixedly-connecting to the above-mentioned robotic flange 30. As shown in FIG. 3, the top surface 10T is disposed with a plurality of lock-fastener holes 101. For example, six lock-fastener holes are disposed in the present embodiment and the six lock-fastener holes 101 are arranged in a rectangular array with three lock-fastener holes 101 in each row, wherein a protruding portion 14 and a hemi-circular sliding portion are further disposed between the left row and the right row of lock-fastener holes 101. The protruding portion 14 is disposed at the central part of the rectangular array and comprises a cylinder 141 and a square protrusion 142. The cylinder 141 is a cylindrical structure formed by extending upward from the top 10T, and the above-mentioned square protrusion 142 is further formed by horizontally extending from the free end of the cylinder 141 and in the direction away from the opening 12 of the container body 10. Moreover, a hemi-circular sliding portion 13 extends from the part of the circumference of the protruding portion 14 on the top 10T relatively closer to the opening 12. And as shown in FIG. 3, the hemi-circular sliding portion 13 consists of two quarter-circular sliding portions 131, and each quarter-circular sliding portion 131 extends upward and inward from the top 10T, the cross-section of the quarter-circular sliding portion being in a reverse-L shape.

Figure 4:
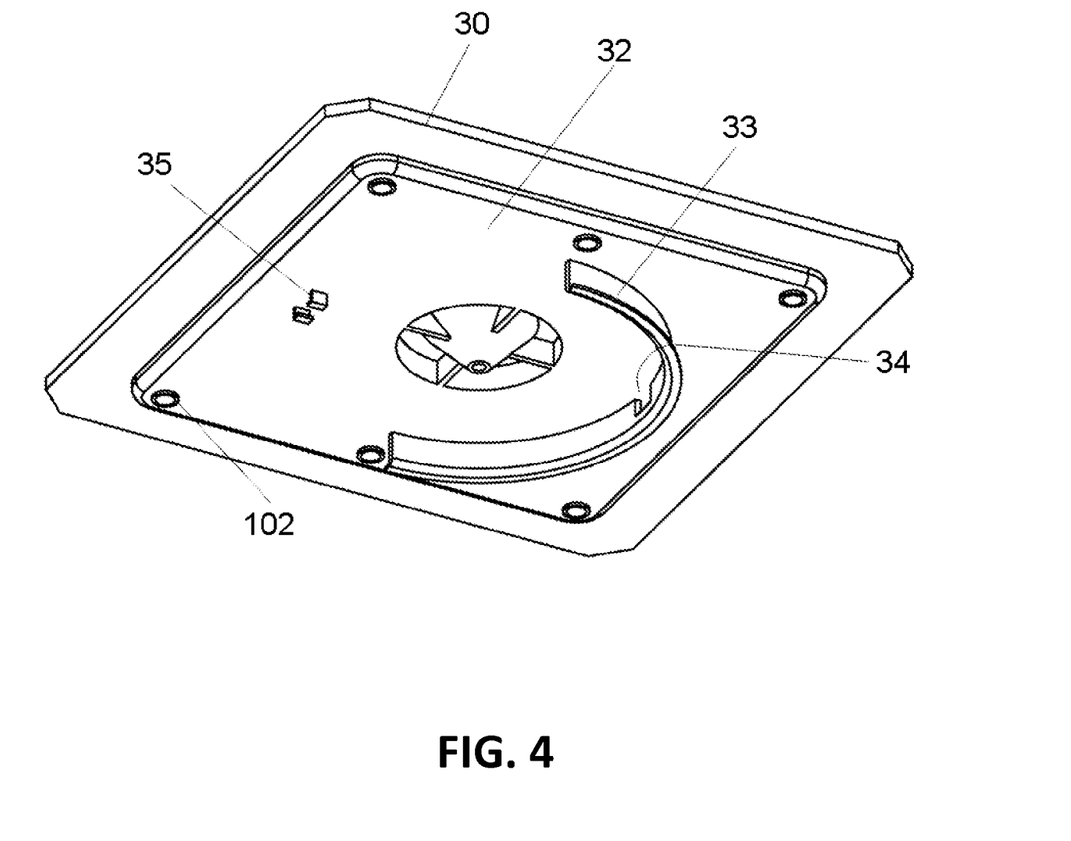
FIG. 4 is a bottom view of the robotic flange of a FOUP of the present invention.
Figure 5A:
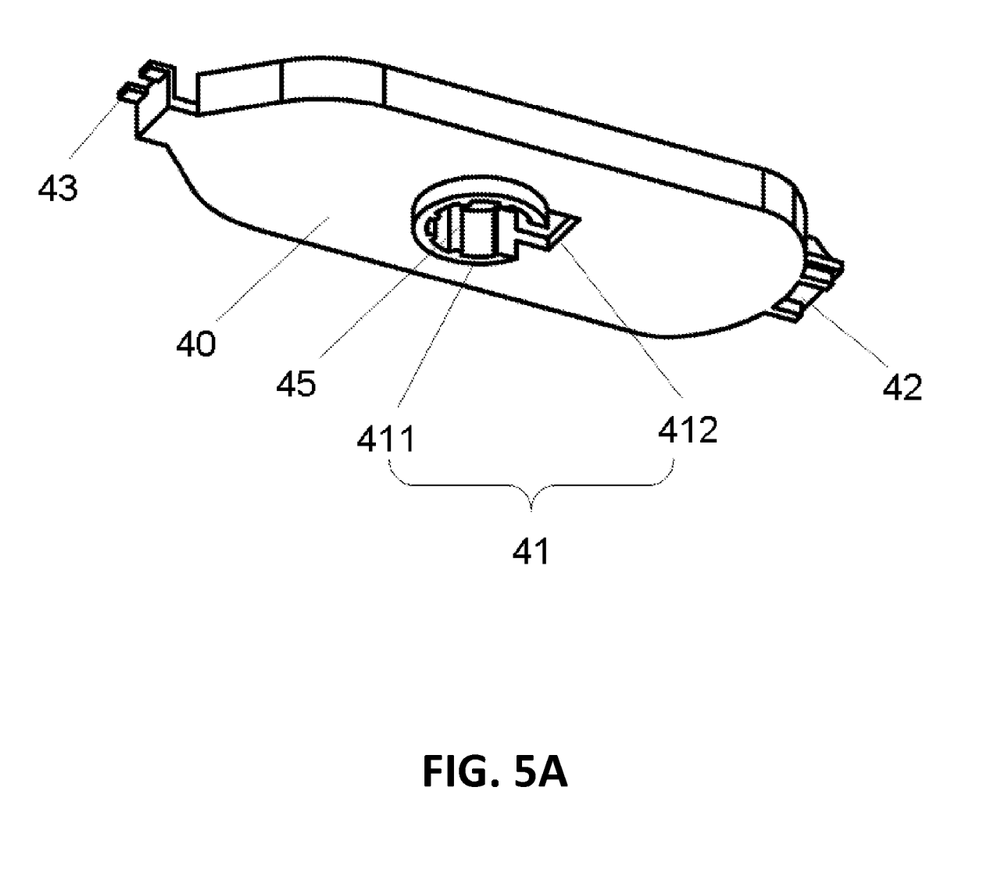
FIG. 5A is a bottom view of the foolproof structure of robotic flange of a FOUP of the present invention.

Referring then to FIG. 4, which is a bottom view of a robotic flange of FOUP of the present invention. As known from FIG. 2 and FIG. 4, the robotic flange 30 is in rectangular shape and has an upper surface 31 and a lower surface 32, wherein fixing component corresponding to the fixing interface of top 10T is disposed on the lower surface 32. In one preferred embodiment of the present invention, the robotic flange 30 is disposed with six through holes 102 that correspond to the six lock-fastener holes 101 of the top 10T. A hemi-circular snap-hook portion 33 is disposed among the six through holes 102, the hemi-circular snap-hook portion 33 being a hook structure extending downward and outward from the lower surface 32 and with L-shaped cross section. A foolproof structure 40 (as shown in FIG. 5A, which is a bottom view of the foolproof structure of the present invention) can be further provided at about the central part of the rectangular array formed by the six through holes 102 that requires the robotic flange 30 to be fixedly connected to the top 10T of the container body 10 at a certain angle as a start. Apparently, the angle at which the robotic flange 30 is aligned with the container body 10 is not limited in the present embodiment.

Figure 5B:
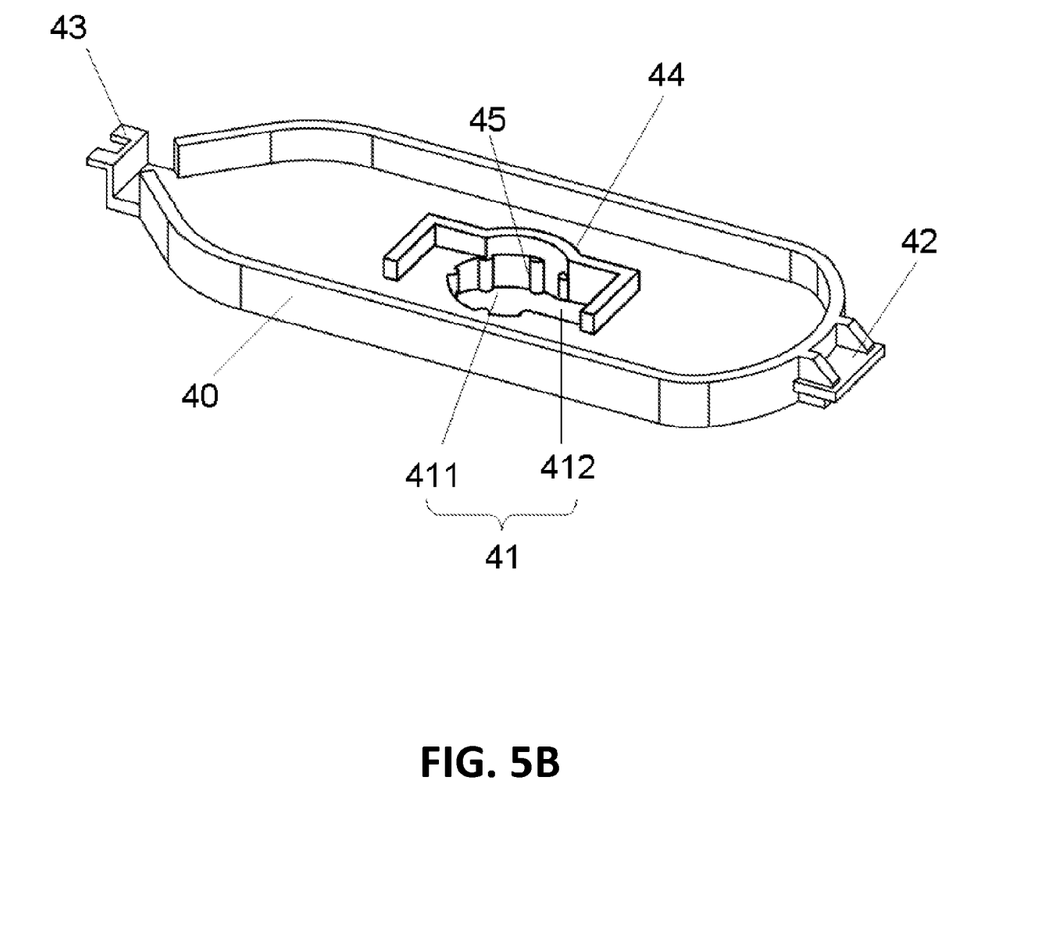
FIG. 5B is a top view of the foolproof structure of robotic flange of a FOUP of the present invention.
Figure 6:
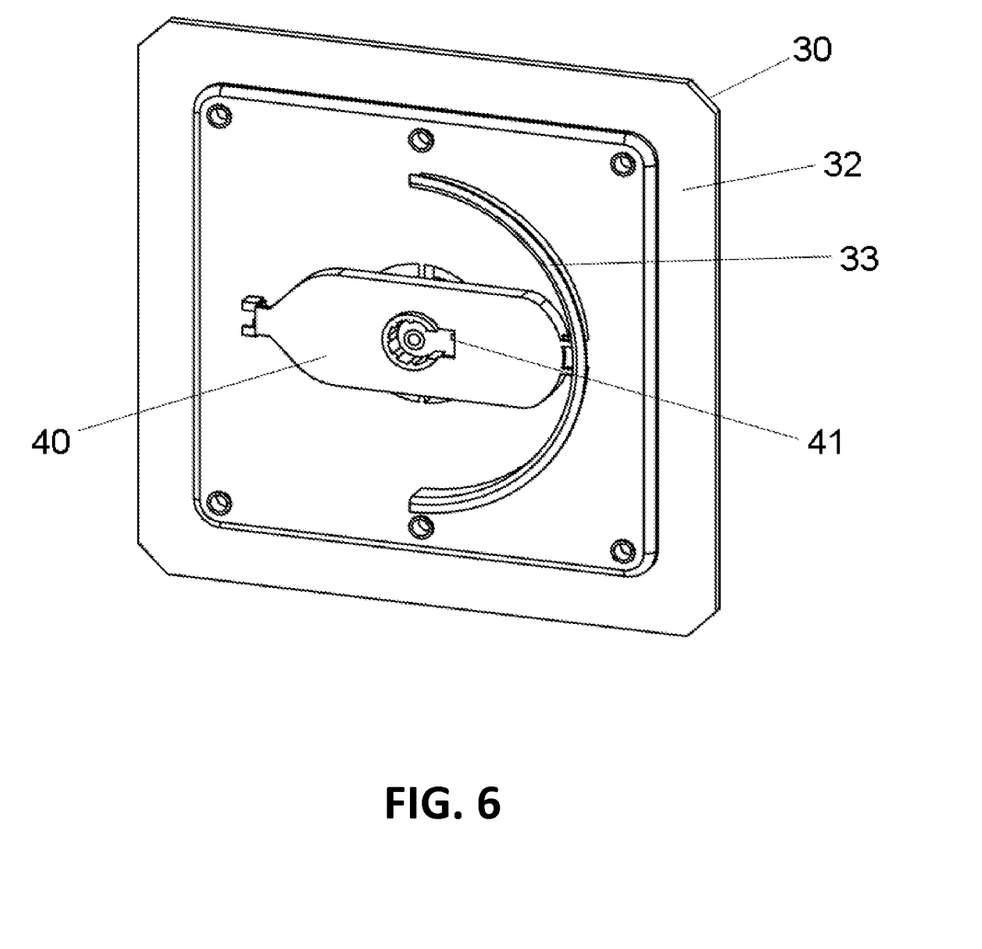
FIG. 6 is a view of the robotic flange and the foolproof structure of a FOUP of the present invention snap-fastened to each other.

Then, referring to FIG. 5B, which is a top view of foolproof structure of the present invention. The foolproof structure 40 has a geometric hole 41 that penetrates the upper and lower surfaces of the foolproof structure 40 and is in the shape of a keyhole in that the hole 41 comprises a round hole 411 and a square hole 412. A tenon 42 and a snap-hook 43 are disposed on two ends of the foolproof structure 40 to snap-fasten to a hole 34 and a snap-slot 35 (as shown in FIG. 4) of the robotic flange 30 for the foolproof structure 40 and the robotic flange 30 to be snap-fastened to and assembled with each other (as shown in FIG. 6).

Figure 7:
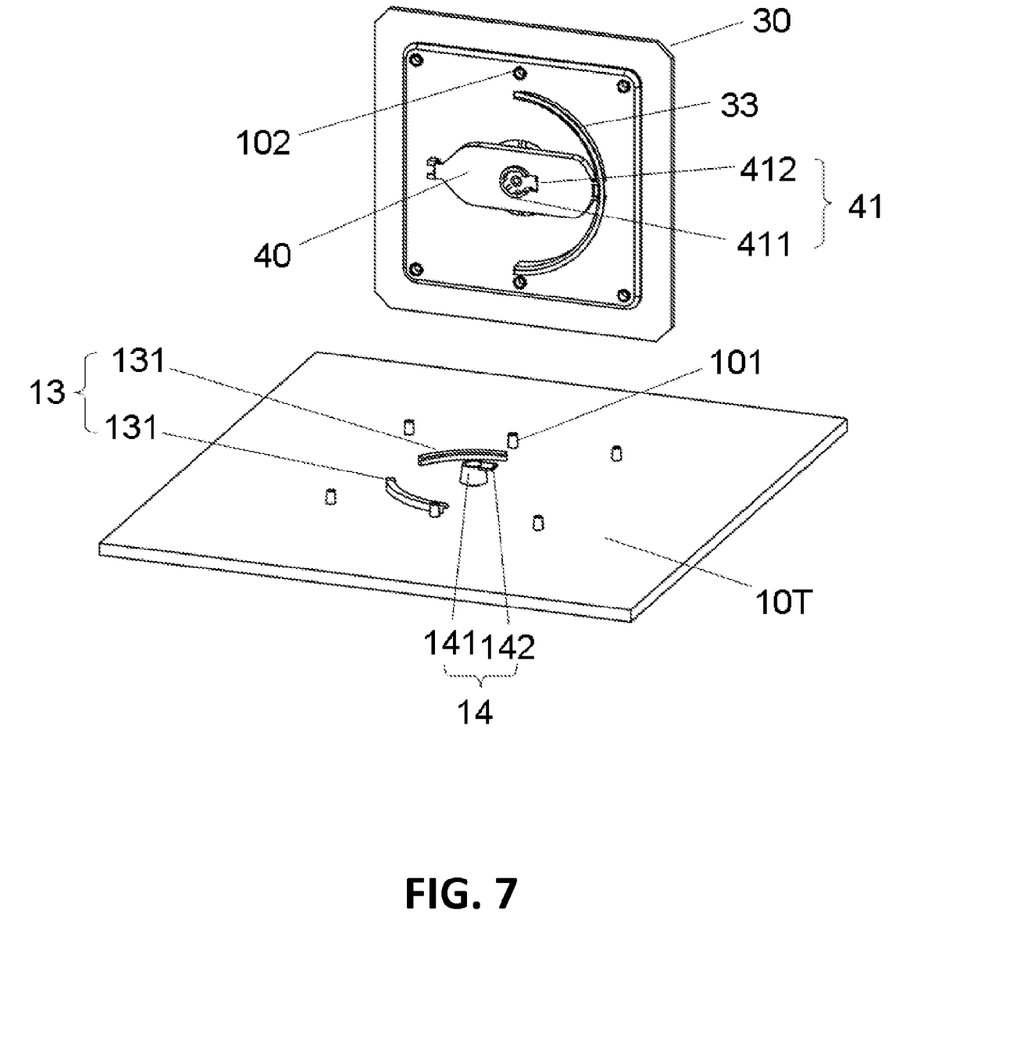
FIG. 7 is a view of the starting position of the foolproof structure and the robotic flange of FOUP of the present invention that are to be fixedly connected to the top of the container body.
Figure 8:
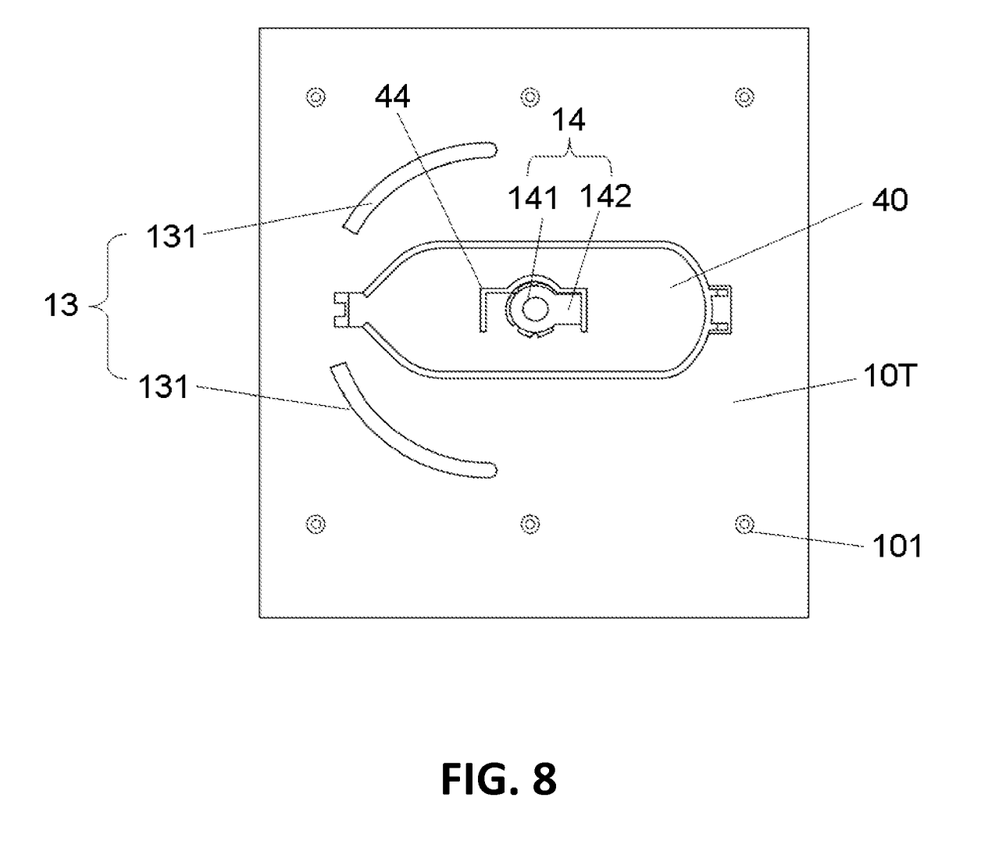
FIG. 8 is a view of the relative positions of the foolproof structure and the top of the container body of FOUP of the present invention when the fixed connection begins.
Figure 9:
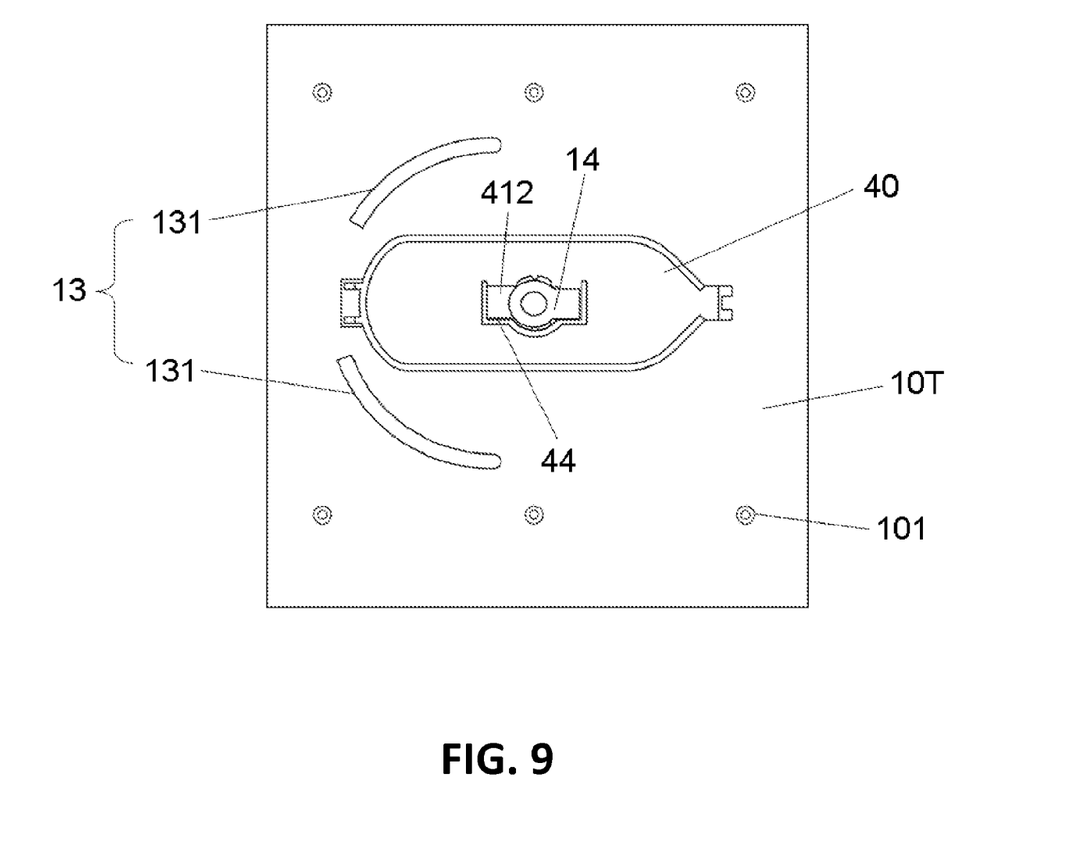
FIG. 9 is a view of the relative positions of the foolproof structure and the top of the container body of FOUP of the present invention when the fixed connection is completed.

Referring then to FIG. 7, which is a view of the starting position of the assembled structure of foolproof structure and robotic flange that is to be fixedly connected to the top of the container body. And FIG. 8 is a view of the relative positions of the foolproof structure and the top of the container body in the above-mentioned starting position, in which the foolproof structure is kept and the robotic flange is removed to facilitate the description. As known from FIG. 7 and FIG. 8, at this starting position, the hole 41 in keyhole shape of the foolproof structure 40 corresponds with the protruding portion 14 of the top 10T, wherein the round hole 411 of the hole 41 in keyhole shape corresponds with the cylinder 141 of the protruding portion 14 whereas the square hole 412 of the hole 41 in keyhole shape corresponds with the square protrusion 142 of the protruding portion 14. What is to be paid particular attention to is that at this starting position, the hemi-circular snap-hook portion 33 of the robotic flange 30 is not directly over the hemi-circular sliding portion 13 of the top 10T. In the beginning, the protruding portion 14 needs to be plugged into the hole 41 in keyhole shape and the hemi-circular snap-hook portion 33 is placed at the inner rim of the hemi-circular sliding portion 13. Later, the assembled structure of foolproof structure 40 and robotic flange 30 is rotated by a certain degree for the hemi-circular snap-hook portion 33 and the hemi-circular sliding portion 13 to be completely snap-fastened to each other, meaning that the hemi-circular snap-hook portion 33 is fully engaged in the hemi-circular sliding portion 13. As shown in FIG. 5B, FIG. 8, and FIG. 9, since one sidewall of the upper surface of foolproof structure 40 to which the hole 41 extends is disposed with a stop rib 44, thus the assembled structure of foolproof structure 40 and robotic flange 30 is limited to rotate counter-clockwise and by about 180 degrees.

After the snap-fastening of the snap-hook portion and the sliding portion is completed, to ensure that the robotic flange 30 is securely fixedly connected to the top 10T of the container body 10, six lock-fastener components such as screws can be further utilized by being passed through the through holes 102 of the robotic flange and lock-fastened onto the lock-fastener holes 101 on the top 10T. Moreover, as shown in FIG. 5A and FIG. 5B, a plurality of ribs 45 are disposed on the inner sidewall of the round hole 411. Therefore, when the assembled structure of foolproof structure 40 and robotic flange 30 is rotated clockwise with the cylinder 141 as center of rotation, the contact area between the round hole 411 and the cylinder 141 can be reduced to prevent from the occurring of particles. The material of the components of wafer container of the present invention, such as the container body 10, the door 20, and the robotic flange 30, can be a thermoplastic resin, i.e. polycarbonate, acrylic resin, PEEK resin, or combination of the above.

The assembly method of the FOUP and its robotic flange of the present invention is then described. First, a FOUP and a robotic flange structure are provided, wherein an embodiment of the FOUP and the robotic flange is as shown in FIGS. 2 to 9. The top 10T of the FOUP is disposed with six lock-fastener holes 101, among which a protruding portion 14 and a hemi-circular sliding portion 13 are further disposed. The protruding portion 14 comprises a cylinder 141 and a square protrusion 142. The lower surface 32 of the robotic flange 30 is disposed with six through holes 102 and a hemi-circular snap-hook portion 33. Moreover, the lower surface 32 of the robotic flange 30 is further disposed with a foolproof structure 40. The foolproof structure 40 has a geometric hole 41 that penetrates the upper and lower surfaces of the foolproof structure 40 and is in keyhole shape in that it comprises a round hole 411 and a square hole 412.

And when the robotic flange 30 is to be assembled or fixedly connected to the FOUP, the robotic flange 30 is aligned with the container body 10 of the FOUP at a certain angle; as shown in FIG. 7, the hole 41 in keyhole shape of the foolproof structure 40 corresponds with the protruding portion 14 on the top 10T, but the hemi-circular snap-hook portion 33 of the robotic flange 30 is not directly over the hemi-circular sliding portion 13 of the top 10T. When the protruding portion 14 is plugged into the hole 41 in keyhole shape and the hemi-circular snap-hook portion 33 is placed at the inner rim of the hemi-circular sliding portion 13, the robotic flange 30 is rotated about 180 degrees for the hemi-circular snap-hook portion 33 to be fully engaged in the hemi-circular sliding portion 13. At this period, the robotic flange 30 and the FOUP are fixedly connected to each other by utilizing the hemi-circular snap-hook and snap-slot. Apparently, the angle at which the robotic flange 30 is aligned with the FOUP is not limited in the present embodiment.

Furthermore, after the snap-fastening of the robotic flange 30 and the FOUP is completed by using the snap-hook and the sliding portion, to ensure that the robotic flange 30 is securely fixedly connected to the top 10T of the container body 10, six lock-fastener components such as screws can be further utilized by being passed through the through holes 102 of the robotic flange and lock-fastened to the lock-fastener holes 101 of the top 10T.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A Front Opening Unified Pod, comprising a container body having a plurality of sidewalls, a bottom, and a top to form a space for accommodating wafers, an opening being formed on one sidewall of said container body for importing and exporting wafers, and a door having an outer surface and an inner surface, said door being connected to said container body via said inner surface, the characteristic of said wafer container in that:

a robotic flange is disposed on said top of said container body, said robotic flange having a lower surface opposite to said top, a foolproof structure and a hemi-circular snap-hook portion being disposed at center of said lower surface and circumference of the center of said lower surface, said foolproof structure having a geometric hole for a protruding portion on said top to be plugged in, wherein said protruding portion is plugged into said geometric hole and said robotic flange is further rotated about 180 degrees to engage said hemi-circular snap-hook portion in a hemi-circular sliding portion of said top of said container body, said foolproof structure further having a tenon and a snap-hook being disposed on two ends of the foolproof structure to snap-fasten to a hole and a snap-slot of the robotic flange.

2. The Front Opening Unified Pod according to claim 1, wherein said foolproof structure is further disposed with a stop rib.

3. The Front Opening Unified Pod according to claim 1, wherein said protruding portion comprises a cylinder and a square protrusion.

4. The Front Opening Unified Pod according to claim 1, wherein said robotic flange further comprises a plurality of lock-fastener components for fixing said robotic flange to said top of said container body.

5. The Front Opening Unified Pod according to claim 1, wherein said robotic flange is made of a thermoplastic resin.

6. The Front Opening Unified Pod according to claim 5, wherein said thermoplastic resin is selected from the group consisting of polycarbonate, acrylic resin, and PEEK resin.

7. The Front Opening Unified Pod according to claim 1, wherein said hemi-circular snap-hook portion is in the shape of an L-shaped hook.

8. The Front Opening Unified Pod according to claim 1, wherein outline of cross section of said hemi-circular sliding portion is reverse L-shaped.

* * * * *